US010274818B2

(12) United States Patent
Lin et al.

(10) Patent No.: US 10,274,818 B2
(45) Date of Patent: Apr. 30, 2019

(54) LITHOGRAPHY PATTERNING WITH SUB-RESOLUTION ASSISTANT PATTERNS AND OFF-AXIS ILLUMINATION

(71) Applicant: Taiwan Semiconductor Manufacturing Co., Ltd., Hsinchu (TW)

(72) Inventors: Hua-Tai Lin, Hsinchu (TW);
Yu-Chuan Yang, Hsinchu (TW);
Wen-Ta Liang, Hsinchu (TW);
Ching-Huang Chen, Hsinchu (TW);
Chi-Yuan Sun, New Taipei (TW);
Shih-Che Wang, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 20 days.

(21) Appl. No.: 15/618,422

(22) Filed: Jun. 9, 2017

(65) Prior Publication Data
US 2018/0174839 A1   Jun. 21, 2018

Related U.S. Application Data

(60) Provisional application No. 62/434,983, filed on Dec. 15, 2016.

(51) Int. Cl.
*G03B 27/42* (2006.01)
*G03F 1/36* (2012.01)
*G03F 7/20* (2006.01)

(52) U.S. Cl.
CPC ............ *G03F 1/36* (2013.01); *G03F 7/70125* (2013.01); *G03F 7/70441* (2013.01)

(58) Field of Classification Search
CPC ............ G03F 7/70191; G03F 7/70116; G03F 7/70058; G03F 7/70108; G03F 7/70125; G03F 7/70308; G03F 7/70158; G03F 7/20; G03F 7/70141; G03F 1/36; G03F 7/70625; G03F 1/0069; G03F 1/144; G03F 1/38;
(Continued)

(56) References Cited

U.S. PATENT DOCUMENTS 7,697,114 B2   4/2010   Chang et al.
8,416,393 B2   4/2013   Wang et al.
(Continued)

OTHER PUBLICATIONS

Biafore, John J. et al., "The Causes of Horizontal-Vertical (H-V) Bias in Optical Lithography: Dipole Source Errors", Proc. SPIE 6520, Optical Microlithography XX, Mar. 26, 2007, 18 pages.
(Continued)

*Primary Examiner* — Mesfin T Asfaw
(74) *Attorney, Agent, or Firm* — Haynes and Boone, LLP (57) ABSTRACT

A photolithography system includes a substrate stage for holding a workpiece, and a mask having main patterns and sub-resolution assistant patterns. The system further includes a diffractive optical element (DOE) for directing a radiation having an aerial image of the main patterns onto the workpiece. The DOE includes a first pair of poles that is positioned symmetrically about a center of the DOE along a first direction. The main patterns are oriented lengthwise along a second direction that is perpendicular to the first direction. The sub-resolution assistant patterns are oriented lengthwise along the first direction.

20 Claims, 6 Drawing Sheets

(58) Field of Classification Search
CPC .... G03F 1/50; G03F 7/70216; G03F 7/70641; G03F 7/70666; G03F 7/0002; G03F 1/22; G03F 9/7073; G03F 9/7088; G03F 1/20; G03F 7/70; G03F 7/70075; G03F 7/70091; G03F 7/70683; G03F 9/7076; G03F 9/7084

See application file for complete search history.

(56) References Cited

U.S. PATENT DOCUMENTS

| | | | |
|---|---|---|---|
| 8,753,904 B2 | 6/2014 | Tsai et al. | |
| 8,767,178 B2 | 7/2014 | Lin et al. | |
| 8,796,666 B1 | 8/2014 | Huang et al. | |
| 8,802,354 B2 | 8/2014 | Chang | |
| 8,841,058 B2 | 9/2014 | Chang | |
| 8,895,234 B2 | 11/2014 | Chang et al. | |
| 9,093,530 B2 | 4/2015 | Huang et al. | |
| 9,046,789 B2 | 6/2015 | Lin et al. | |
| 9,128,384 B2 | 9/2015 | Lin et al. | |
| 9,287,234 B2 | 3/2016 | Wu et al. | |
| 9,548,303 B2 | 1/2017 | Lee et al. | |
| 2002/0192570 A1* | 12/2002 | Smith | G03F 1/36 430/5 |
| 2011/0212403 A1 | 9/2011 | Kuo et al. | |
| 2012/0083124 A1* | 4/2012 | Huang | G03F 1/36 438/694 |
| 2016/0033866 A1 | 2/2016 | Lu et al. | |

OTHER PUBLICATIONS

Mack, Chris A., "Off-Axis Illumination", Tutor42.doc; Version 4/20/03, http://lithoguru.com/scientist/litho tutor/TUTOR42%20(Aug% 2003).pdf, Aug. 2003, 4 pages.

\* cited by examiner

LITHOGRAPHY PATTERNING WITH SUB-RESOLUTION ASSISTANT PATTERNS AND OFF-AXIS ILLUMINATION

PRIORITY

This claims the benefits of U.S. Prov. App. Ser. No. 62/434,983, entitled "Mask Pattern Selectivity Enhancement by Sub-Resolution Dummy Design and Polarity Illumination," filed Dec. 15, 2016, herein incorporated by reference in its entirety.

BACKGROUND

Semiconductor integrated circuit (IC) technology has experienced rapid progress including the continued minimization of feature sizes and the maximization of packing density. The minimization of feature size relies on improvements in photolithography and its ability to print smaller features or critical dimensions (CD). Various resolution enhancement techniques (RET) have been developed to enhance the resolution of photolithography. An example of such a technique is off-axis illumination (OAI). OAI illumination may include any radiation that reduces and/or eliminates the "on-axis" (on the optical axis) component of the radiation. For OAI, however, the shape and size of the illumination must be designed and/or optimized for the specific pattern that is to be printed on a substrate. Another RET that is often used together with OAI is double dipole lithography (DDL) or double patterning. In DDL, patterns are split into a vertical pattern and a horizontal pattern, which in turn requires two (double) exposure processes. Each of the exposure processes in DDL may use an appropriate OAI. However, even with DDL and OAI, loading effects during mask fabrication are still a concern where a single mask (or reticle) may include dense patterns and isolated patterns.

Improvements in one or more of these areas are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor photolithography systems and methods, and more particularly related to a photolithography system having a dipole illumination and a mask (or reticle) with main patterns and sub-resolution assistant patterns. In an embodiment, the main patterns are located in an area of the mask where mask patterns are isolated, and the sub-resolution assistant patterns are placed adjacent the main patterns for reducing mask fabrication loading effects and/or providing optical proximity benefits. The orientations of the main patterns and the sub-resolution assistant patterns are perpendicular to each other. The dipole illumination is perpendicular to the orientation of the main pattern and is parallel to the orientation of the sub-resolution assistant patterns. The dipole illumination is designed for printing out the main patterns onto a substrate while simultaneously not printing out the sub-resolution assistant patterns onto the same substrate.

In the present disclosure, a "sub-resolution" assistant pattern refers to a single pattern having a width that is less than the resolution of the photolithography system. In other words, the photolithography system does not print out the sub-resolution assistant pattern. It is understood that when a plurality of sub-resolution assistant patterns is placed close enough to each other (i.e., the pattern pitch is less than certain threshold), the plurality of the sub-resolution assistant patterns may cause the photolithography system to print out certain image(s) although the image(s) may not match the original layout of the plurality of the sub-resolution assistant patterns.

Further, in the present disclosure, pattern density of a plurality of uniformly sized and spaced patterns (e.g., line patterns) is defined as the ratio between the width of a single pattern and the pitch of the patterns. In various embodiments of the present disclosure, the pattern density of the sub-resolution assistant patterns is within ±15% of the pattern density of the main patterns, such as within ±5% of the pattern density of the main patterns. The closely matched pattern density between the sub-resolution assistant patterns and the main patterns help alleviate mask fabrication process loading.

Figure 1:
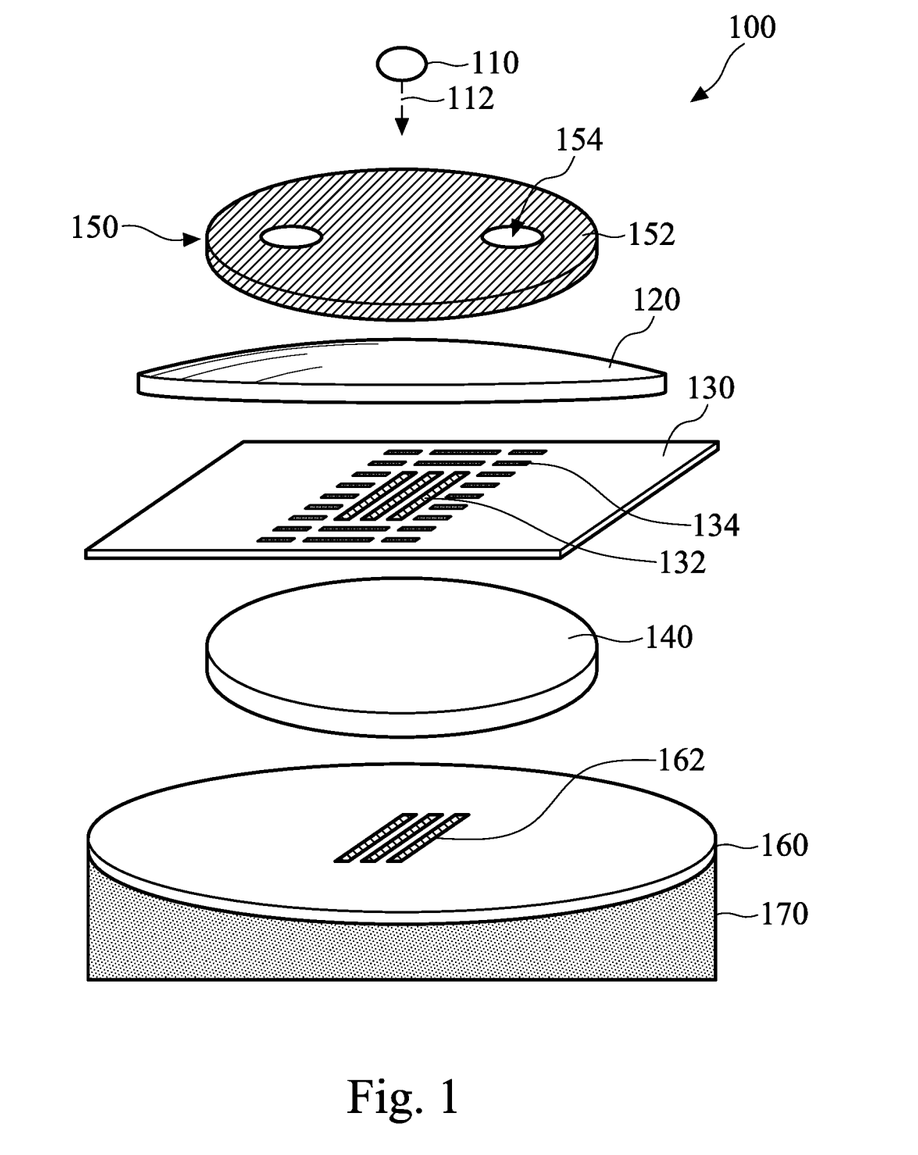
FIG. 1 is a schematic view of an embodiment of a lithography system, constructed according to aspects of the present disclosure.

FIG. 1 is a simplified schematic view of an embodiment of a photolithography (or lithography) system 100, constructed according to the present disclosure. Referring to FIG. 1, the lithography system 100 includes a radiation source (or illumination source) 110. The radiation source 110 may be any suitable radiation source. For example, the radiation source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other radiation sources having a desired wavelength (e.g., below approximately 100 nm). The radiation source 110 may include an optical source selected from the group consisting of ultraviolet (UV) source, deep UV (DUV) source, extreme UV (EUV) source, and X-ray source. The radiation source 110 may alternatively include a particle source selected from the group consisting of electron beam (E-Beam) source, ion beam source, and plasma source. It is understood that in the above description of radiation sources, each radiation source may have a certain wavelength distribution rather than an exact single wavelength. For example, the I-line (e.g., 365 nm) wavelength of the mercury lamp may not be exactly 365 nm, but may be centered at approximately 365 nm with a range of varying wavelengths extending above and below 365 nm. This range may be used to determine a minimum possible line width during photolithography, with less variation from the desired 365 nm wavelength resulting in a thinner line width. The radiation source 110 generates a radiation (or radiation energy) 112 that has a central wavelength as discussed above.

The lithography system 100 includes a condenser lens 120. The condenser lens 120 may comprise a single lens element or multiple lens elements, and may include microlens arrays, shadow masks, and/or other structures designed to aid in directing light from the radiation source 110 onto a photomask (e.g., photomask 130). The lithography system 100 further includes an objective lens 140. The objective lens 140 may have a single lens element or multiple lens elements. Each lens element may include a transparent substrate and may further include a plurality of coating layers. The transparent substrate may be made of fused silica ($SiO2$), calcium-fluoride ($CaF2$), lithium fluoride (LiF), barium fluoride ($BaF2$), or other suitable material. The materials used for each lens element may be chosen based on the wavelength of the radiation 112 used in the lithography system 100 to minimize absorption and scattering. The condenser lens 120 and the objective lens 140 are collectively referred to as an imaging lens. The imaging lens may further include additional components such as an entrance pupil and an exit pupil to form an image defined in a photomask (e.g., photomask 130) onto a substrate (e.g. substrate 160) to be patterned.

During a lithography patterning process, a photomask (also referred to as a mask or a reticle) 130 may be included in the lithography system 100. In an embodiment, the mask 130 is a transmissive mask that may include a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN. A radiation beam, such as the radiation 112, may be partially or completely blocked when directed onto an absorption region. The absorption layer may be patterned to have one or more openings through which a radiation beam may travel without being absorbed by the absorption layer, thereby creating a patterned radiation beam. In another embodiment, the mask 130 is a reflective mask comprising a low thermal expansion material (LTEM) substrate with a plurality of reflective layers disposed over the LTEM substrate and a patterned absorption layer disposed over the reflective layers. In such an embodiment, the mask 130 selectively absorbs some portions and reflects other portions of the radiation beam such as the radiation 112, thereby creating a patterned radiation beam. The mask 130 may incorporate resolution enhancement techniques such as phase shift mask (PSM) and/or optical proximity correction (OPC).

The mask 130 includes various mask patterns which correspond to the patterned absorption layer in either a transmissive mask or a reflective mask. In the present embodiment, the mask 130 includes main patterns 132 and sub-resolution assistant patterns 134. The main patterns 132 are designed to be printed onto a substrate by the lithography system 100, while the sub-resolution assistant patterns 134 are designed not to be printed onto the same substrate. In an embodiment, each of the main patterns 132 is a line pattern having a width greater than the resolution of the lithography system 100, and each of the sub-resolution assistant patterns 134 is a line pattern having a width smaller than the resolution of the lithography system 100. In a further embodiment, the main patterns 132 have a width that is more than twice of a width of the sub-resolution assistant patterns 134. The large difference in their widths helps enlarge the design window for the lithography system 100. For example, the design window for the design of the imaging lens 120 and 140 may be enlarged. In various embodiments, the main patterns 132 and/or the sub-resolution assistant patterns 134 may have other shapes in addition to or alternative to line patterns. In embodiments, the main patterns 132 may be used to form circuit features, such as active regions, isolation structures, metal lines, and gate structures. The sub-resolution assistant patterns 134 may also be referred to as dummy patterns because they are not used to form any circuit features on a substrate.

In the present embodiment, the main patterns 132 are located in an isolated region of the mask 130. In other words, the main patterns 132 are separated from other main patterns by relatively large space. Although not shown, the mask 130 may include one or more dense regions where main patterns are closely packed. When a mask has both dense and isolated regions, the pattern density difference may have iso-dense loading effects during mask fabrication and induce CD errors. In the present embodiment, the sub-resolution assistant patterns 134 are placed adjacent the main patterns 132, more particularly surrounding the main patterns 132 on all sides, for reducing mask fabrication loading effects. For example, the sub-resolution assistant patterns 134 may be placed around all four sides of a rectangular area where the main patterns 132 are located. Further, the pattern density of the sub-resolution assistant patterns 134 is designed to closely match the pattern density of the main patterns 132. For example, the pattern density of the sub-resolution assistant patterns 134 is designed to be within ±15% of the pattern density of the main patterns 132, such as within ±5% of the pattern density of the main patterns 132. If the pattern density of the sub-resolution assistant patterns 134 is outside the above range, having the sub-resolution assistant patterns 134 may not effectively reduce mask fabrication loading effects.

Further, in the present embodiment, the main patterns 132 are oriented lengthwise along a first direction, and the sub-resolution assistant patterns 134 are oriented lengthwise along a second direction perpendicular to the first direction. The reasons for configuring pattern orientation as such will become clear along with the discussion of a diffractive optical element (DOE) 150 included in the lithography system 100.

Still referring to FIG. 1, the diffractive optical element (DOE) 150 may be positioned between the radiation source 110 and the condenser lens 120 or other possible locations. The DOE 150 includes a plate 152 with a pair of poles 154 for achieving off-axis illumination, particularly, a dipole illumination in this example. The plate 152 is opaque to the radiation 112 so that the radiation illuminated on the plate 152 will be blocked from transmitting through. The plate 152 may be made of a metal, metal alloy, or other proper material. The plate 152 may include proper coating materials. The plate 152 may have a circular perimeter defining a center to be aligned with the optical axis during a lithography process. A plurality of diametrical axis can be defined crossing the center (e.g., crossing perpendicular to the optical axis) of the plate 152.

The poles 154 are transmissive to the radiation 112, and may include transparent or translucent materials, an opening, and/or other suitable material. In the present embodiment, the pair of poles 154 is positioned symmetrically about the center of the plate 152 along a diametrical axis of the plate 152, which is located in a plane perpendicular to the optical axis of the radiation 112. In alternative embodiments, the DOE 150 may include more than one pair of poles. The pair of poles 154 may be designed in various shapes (e.g., circular, curvy, polygonal), sizes, positions, and angles in order to optimize the performance of the lithography system 100. For example, variables such as the numerical aperture (NA) of the objective lens 140, wavelength of radiation 112, properties (e.g., pitch, size) of mask patterns 132/134 to be exposed, and the like, would be recognized as applicable to the selection of the configuration, size, shape, and/or angle of poles 154.

In an embodiment, the DOE 150 is designed and/or optimized for an x-dipole illumination, wherein the pair of poles 154 are oriented symmetrically about the origin and positioned upon the x-axis of the pupil, and the main patterns 132 are oriented along the y-axis of the pupil. In other words, the diametrical axis that goes through the pair of poles 154 is perpendicular to the lengthwise orientation of the main patterns 132. In the x-dipole illumination, the diffraction pattern of vertical, y-oriented main patterns 132 will spread across the x-axis of the pupil. The sigma center ($\sigma_{center}$) of the DOE 150 may be designed for maximum depth of focus for given mask pattern pitch, radiation wavelength, and numerical aperture such that the y-oriented main patterns 132 will have both the zero diffraction order and the ±1 diffraction orders within the pupil of the objective lens 140. In such a way, the printing of the main patterns 132 onto the substrate 160 is made to have a high contrast. The minimal pitch that will image for y-oriented main patterns 132 with x-dipole illumination may be given as:

$$\text{Pitch}_{x\text{-dipole, }y\text{-patterns}} = \lambda/(NA(1+\sigma_{center})) \qquad (1)$$

where λ is the wavelength of the radiation 112, NA is the numerical aperture of the objective lens 140, and $\sigma_{center}$ is less than 1.

However, if the sub-resolution assistant patterns 134 are also y-oriented, there is a risk that the same DOE 150 designed for the y-oriented main patterns 132 will also print out the sub-resolution assistant patterns 134, particularly when the pitch of the sub-resolution assistant patterns 134 is greater than the $\text{Pitch}_{x\text{-dipole, }y\text{-pattern}}$ given in equation (1). Consequently, the design window for the main patterns 132 and the sub-resolution assistant patterns 134, such as widths and pitches, will be limited.

In the present embodiment, the sub-resolution assistant patterns 134 are oriented lengthwise perpendicular to the lengthwise orientation of the main patterns 132. In the x-dipole illumination, the sub-resolution assistant patterns 134 are x-oriented, i.e., parallel to the diametrical axis that goes through the poles 154. For a given DOE 150, the minimal pitch that will image for x-oriented assistant patterns 134 with x-dipole illumination may be given as:

$$\text{Pitch}_{x\text{-dipole, }x\text{-patterns}} = \lambda/(NA(\sqrt{(1-\sigma_{center}^2)})), \sigma_{center}<1 \qquad (2)$$

Of course, since the sub-resolution assistant patterns 134 are designed not to be printed out, the pitch of the sub-resolution assistant patterns 134 is designed to be less than $\text{Pitch}_{x\text{-dipole, }x\text{-patterns}}$. Further, since $\sigma_{center}$ is less than 1, $\text{Pitch}_{x\text{-dipole, }x\text{-patterns}}$ is greater than $\text{Pitch}_{x\text{-pole, }y\text{-patterns}}$, which means that there is a larger window for designing the pitch of the x-oriented assistant patterns 134 with x-dipole illumination without concerning about printing out the sub-resolution assistant patterns 134 than it would be if the sub-resolution assistant patterns 134 were y-oriented.

In another embodiment, the DOE 150 is designed and/or optimized for a y-dipole illumination, wherein the pair of poles 154 are oriented symmetrically about the origin and positioned upon the y-axis of the pupil, and the main patterns 132 are oriented along the x-axis of the pupil. In other words, the diametrical axis that goes through the pair of poles 154 is perpendicular to the lengthwise orientation of the main patterns 132. In the y-dipole illumination, the diffraction pattern of horizontal, x-oriented main patterns 132 will spread across the y-axis of the pupil. The minimal pitch that will image for x-oriented main patterns 132 with y-dipole illumination may be given as:

$$\text{Pitch}_{y\text{-dipole, }x\text{-patterns}} = \lambda/(NA(1+\sigma_{center})) \qquad (3)$$

where λ is the wavelength of the radiation 112, NA is the numerical aperture of the objective lens 140, and an $\sigma_{center}$ is less than 1. The sub-resolution assistant patterns 134 are oriented lengthwise perpendicular to the lengthwise orientation of the main patterns 132. In the y-dipole illumination, the sub-resolution assistant patterns 134 are y-oriented, i.e., parallel to the diametrical axis that goes through the poles 154. For a given DOE 150, the minimal pitch that will image for y-oriented assistant patterns 134 with y-dipole illumination may be given as:

$$\text{Pitch}_{y\text{-dipole, }y\text{-patterns}} = \lambda/(NA(\sqrt{/(1-\sigma_{center}^2)})), \sigma_{center}<1 \qquad (2)$$

Again, since the sub-resolution assistant patterns 134 are designed not to be printed out, the pitch of the sub-resolution assistant patterns 134 is designed to be less than $\text{Pitch}_{y\text{-dipole. }y\text{-patterns}}$. Further, since $\sigma_{center}$ is less than 1, $\text{Pitch}_{y\text{-dipole. }y\text{-patterns}}$ is greater than $\text{Pitch}_{y\text{-dipole, }x\text{-patterns}}$, which means that there is a larger window for designing the pitch for the y-oriented assistant pattern 134 with y-dipole illumination without concerning about printing out the sub-resolution assistant patterns 134 than it would be if the sub-resolution assistant patterns 134 were x-oriented.

The lithography system 100 may further include a mask stage (not shown) capable of securing and moving the mask 130 in translational and rotational modes. The lithography system 100 may further include a substrate stage 170 capable of securing and moving a substrate 160 in translational and rotational modes such that the substrate 160 may be aligned with the mask 130. The substrate 160 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 160 may have a photosensitive coating layer (e.g., photoresist) formed thereon during the lithography process. An exemplary photoresist includes chemical amplification resist (CAR). Once the mask 130 and the substrate 160 are aligned, an exposure process may be performed to form an image 162 of the main patterns 132 onto the substrate 160. Due to the co-optimization of the DOE 150 and the mask 130 as discussed above, the sub-resolution assistant patterns 134 are not printed onto the substrate 160 while the main patterns 132 are printed onto the substrate 160 with high fidelity.

The lithography system 100 may also incorporate other techniques and components. For example, the lithography system may also include components and mechanism to implement an immersion lithography process.

Figure 2A:
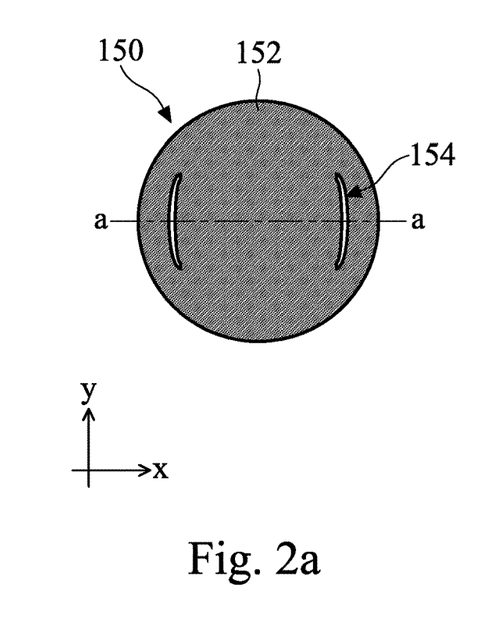
FIGS. 2a, 2b, 2c, 2d, 2e, and 2f show exemplary embodiments of diffractive optical element (DOE), according to aspects of the present disclosure.
Figure 2B:
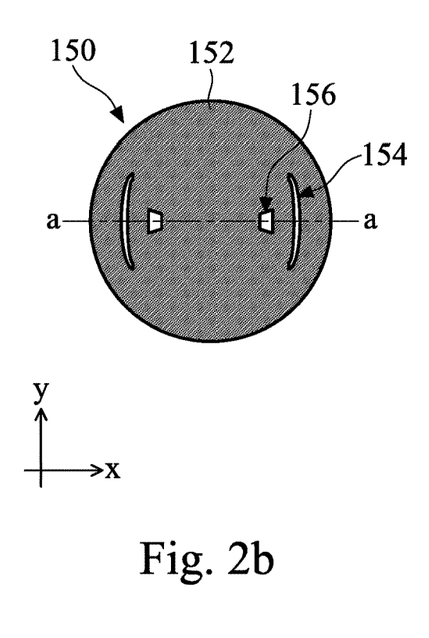
Figure 2C:
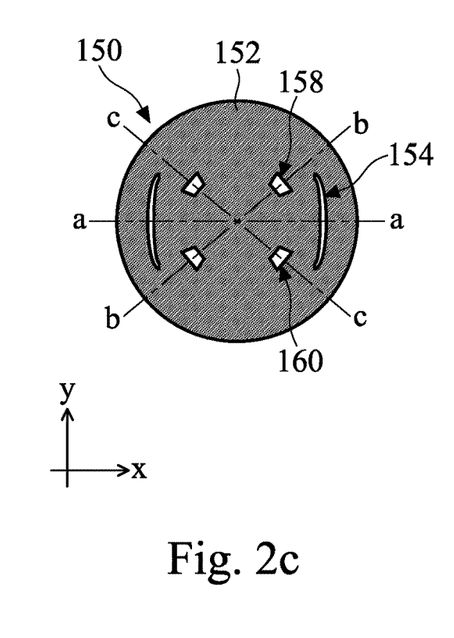
Figure 2D:
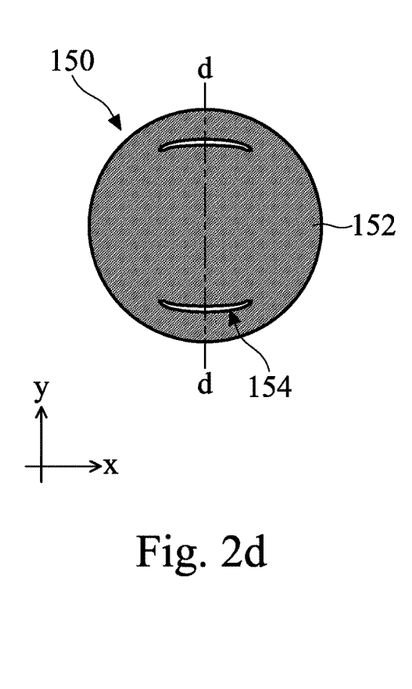
Figure 2E:
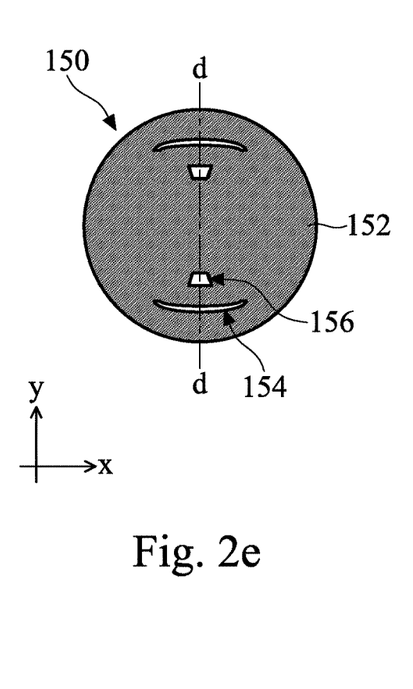
Figure 2F:
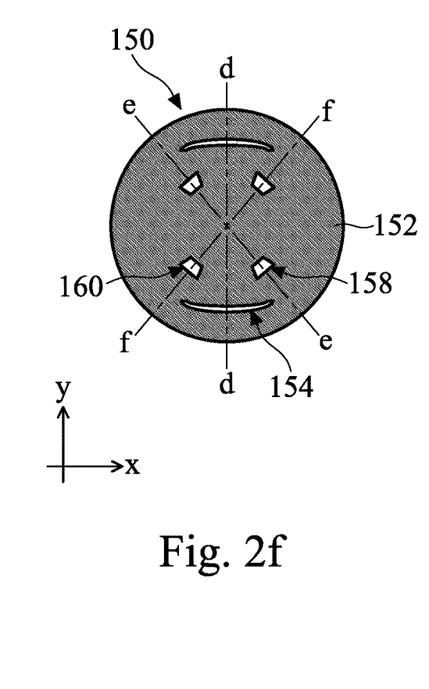

FIGS. 2a-2f illustrate schematic views of some exemplary embodiments of the DOE 150. Particularly, FIGS. 2a-2c illustrate embodiments of the DOE 150 designed for x-dipole illumination, and FIGS. 2d-2f illustrate embodiments of the DOE 150 designed for y-dipole illumination.

Figure 3A:
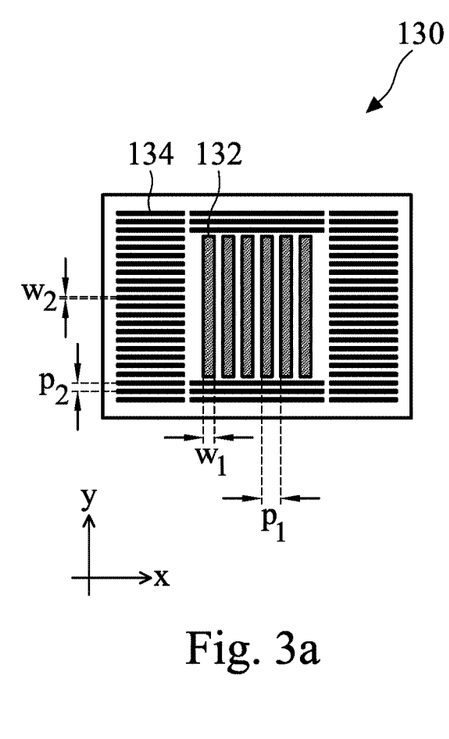
FIGS. 3a, 3b, 3c, 3d, 3e, and 3f show exemplary embodiments of masks with main patterns and sub-resolution assistant patterns, according to aspects of the present disclosure.
Figure 3B:
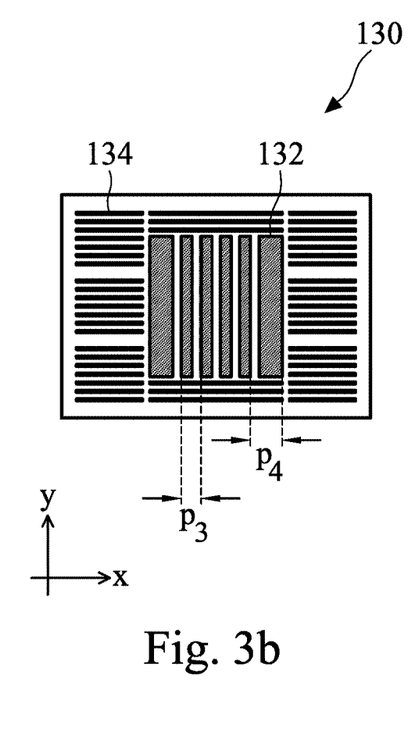
Figure 3C:
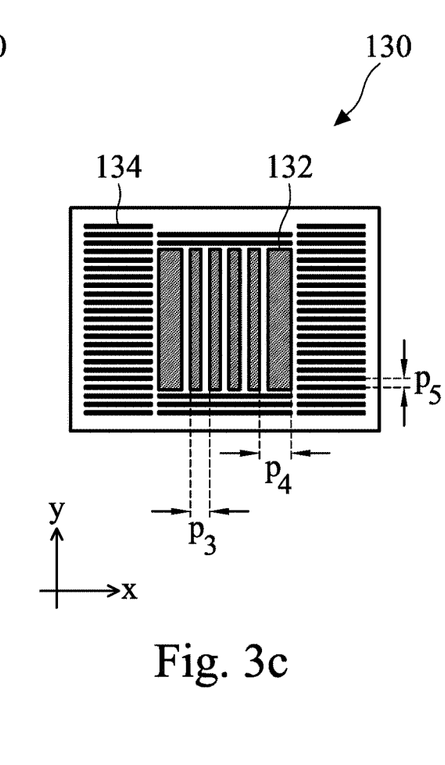
Figure 3D:
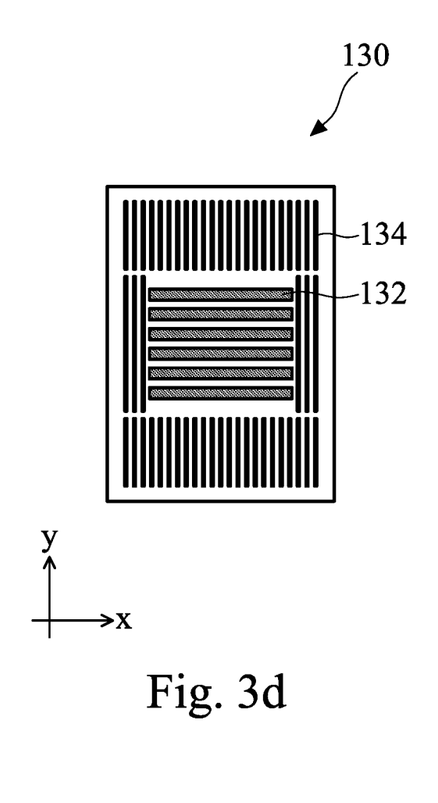
Figure 3E:
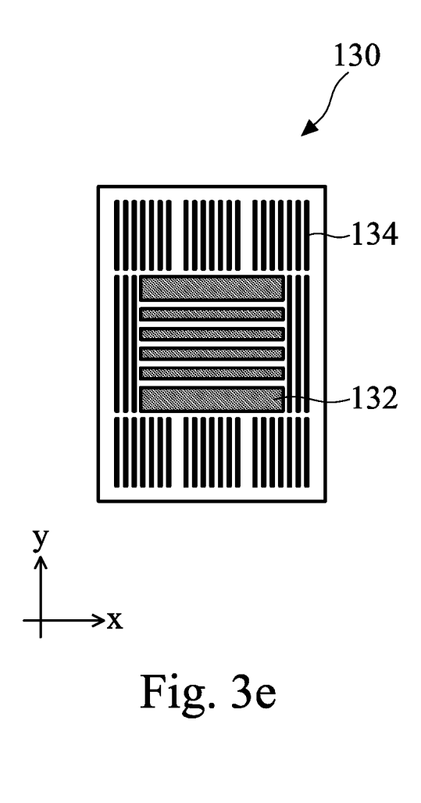
Figure 3F:
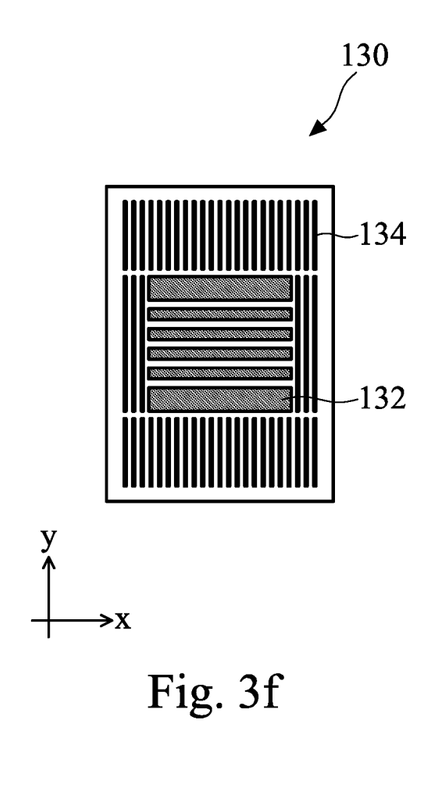

FIGS. 3a-3f illustrate schematic views of some exemplary embodiments of the mask 130. Particularly, FIGS. 3a-3c illustrate embodiments of the mask 130 for use with x-dipole illumination, and FIGS. 3d-3f illustrate embodiments of the mask 130 for use with y-dipole illumination.

Referring to FIG. 2a, the DOE 150 includes the plate 152 and a pair of poles 154 that are positioned symmetrically about the center of the DOE 150 along the x-axis (diametrical a-a axis). The poles 154 have a shape of narrow arch in this embodiment. The material and configuration of the plate 152 and the poles 154 have been discussed above with reference to FIG. 1.

Referring to FIG. 2b, the DOE 150 includes the plate 152 and the pair of poles 154, and further includes another pair of poles 156. The pair of poles 156 is also positioned symmetrically about the center of the DOE 150 along the x-axis. The pair of poles 156 has a shorter pole-to-pole distance than the pair of poles 154, and may further be configured to have a smaller size than the pair of poles 154. As discussed above, since $\sigma_{center}$ is related to the mask pattern pitch to be printed, the pair of poles 154 and the pair of poles 156 are selectively designed for different main pattern pitches. For example, when the main patterns 132 have multiple pitches (such as shown in FIG. 3b), the DOE 150 with two pairs of poles may be optimized simultaneously for multiple main pattern pitches.

Referring to FIG. 2c, the DOE 150 includes the plate 152 and the pair of poles 154, and further includes a pair of poles 158 and a pair of poles 160. The pair of poles 158 is positioned symmetrically about the center of the DOE 150 along a diametrical axis b-b. The pair of poles 160 is positioned symmetrically about the center of the DOE 150 along a diametrical axis c-c. In the present embodiment, the a-a and b-b axis form an angle that is less than or equal to 45 degrees, and the a-a and c-c axis form an angle that is less than or equal to 45 degrees. Further, the pair of poles 158 and the pair of poles 160 are positioned symmetrically about the a-a axis (the x-axis). Effectively, the DOE 150 in FIG. 2c is a dipole-like DOE. The poles 154, 158, and 160 may be configured for illuminating a mask with multiple pattern pitches, such as some embodiments of the mask 130 as shown in FIGS. 3a-3c.

The embodiments of the DOE 150 shown in FIGS. 2d-2f are similar to those in FIGS. 2a-2c, respectively, except that they are configured for y-dipole illumination. For example, in FIG. 2d, the DOE 150 includes the plate 152 and a pair of poles 154 that are positioned symmetrically about the center of the DOE 150 along the y-axis (diametrical d-d axis). Similarly, in FIG. 2e, the DOE 150 includes the plate 152, a pair of poles 154 and a pair of poles 156 that are positioned symmetrically about the center of the DOE 150 along the y-axis. The pair of poles 156 has a shorter pole-to-pole distance than the pair of poles 154. In FIG. 2f, the DOE 150 includes the plate 152 and a pair of poles 154 that is positioned symmetrically about the center of the DOE 150 along the y-axis, and further includes a pair of poles 158 and a pair of poles 160. The pair of poles 158 is positioned symmetrically about the center of the DOE 150 along a diametrical e-e axis. The pair of poles 160 is positioned symmetrically about the center of the DOE 150 along a diametrical f-f axis. The d-d and e-e axis form an angle that is less than or equal to 45 degrees. The d-d and f-f axis form an angle that is less than or equal to 45 degrees. Further, the pair of poles 158 and the pair of poles 160 are positioned symmetrically about the d-d axis. The poles 154, 158, and 160 may be configured for illuminating a mask with multiple pattern pitches, such as some embodiments of the mask 130 as shown in FIGS. 3d-3f.

Referring to FIG. 3a, the mask 130 includes main patterns 132 and sub-resolution assistant patterns 134. The main patterns 132 are oriented lengthwise along the y-axis, and the sub-resolution assistant patterns 134 are oriented lengthwise along the x-axis perpendicular to the y-axis. In this embodiment, the main patterns 132 are uniformly sized and spaced with a width $w_1$ and a pitch $p_1$, and the sub-resolution assistant patterns 134 are uniformly sized and spaced with a width $w_2$ and a pitch $p_2$. The width $w_1$ is greater than the resolution of the lithography system 100, and the width $w_2$ is less than the resolution of the lithography system 100. In an embodiment, the width $w_1$ is more than twice of the width $w_2$. In another embodiment, the pitch $p_1$ is more than twice of the pitch $p_2$. Further, the pitches $p_1$ and $p_2$ are designed according to the principles shown in the equations (1) and (2) above. The pattern density of the main patterns 132 is defined to be the ratio between $w_1$ and $p_1$. The pattern density of the sub-resolution assistant patterns 134 is defined to be the ratio between $w_2$ and $p_2$. The pattern density of the sub-resolution assistant patterns 134 is within ±15% of the pattern density of the main patterns 132, such as within ±5%. In a further embodiment, the pattern density of the sub-resolution assistant patterns 134 ranges from 15% to 25%. In experiments where the pitch $p_2$ ranges from 50 to 100 nm, the sub-resolution assistant patterns 134 with the above pattern density range (15% to 25%) are shown to provide effective process loading and without causing imaging errors.

Referring to FIG. 3b, the mask 130 includes main patterns 132 having different sizes along the x-axis and different pitches $p_3$ and $p_4$. The mask 130 further includes sub-resolution assistant patterns 134 that are uniformly sized. The sub-resolution assistant patterns 134 are distributed in groups. Within each group, they are uniformly spaced. Between groups, spacing may be different or the same.

Referring to FIG. 3c, the mask 130 includes main patterns 132 having different sizes along the x-axis and different pitches $p_3$ and $p_4$. The mask 130 further includes sub-resolution assistant patterns 134 that are uniformly sized and spaced with the pitch $p_5$. The masks 130 shown in FIGS. 3b and 3c may be used in conjunction with the DOE 150 shown in FIG. 2b or 2c.

The embodiments of the mask 130 shown in FIGS. 3d-3f are similar to those in FIGS. 3a-3c, respectively, except that they are to be used for y-dipole illumination. For example, the masks 130 shown in FIG. 3d-3f have main patterns 132 oriented lengthwise along the x-axis, and sub-resolution assistant patterns 134 oriented lengthwise along the y-axis. The masks 130 shown in FIG. 3d-3f may be used in conjunction with the DOE 150 shown in FIGS. 2d-2f.

Figure 4:
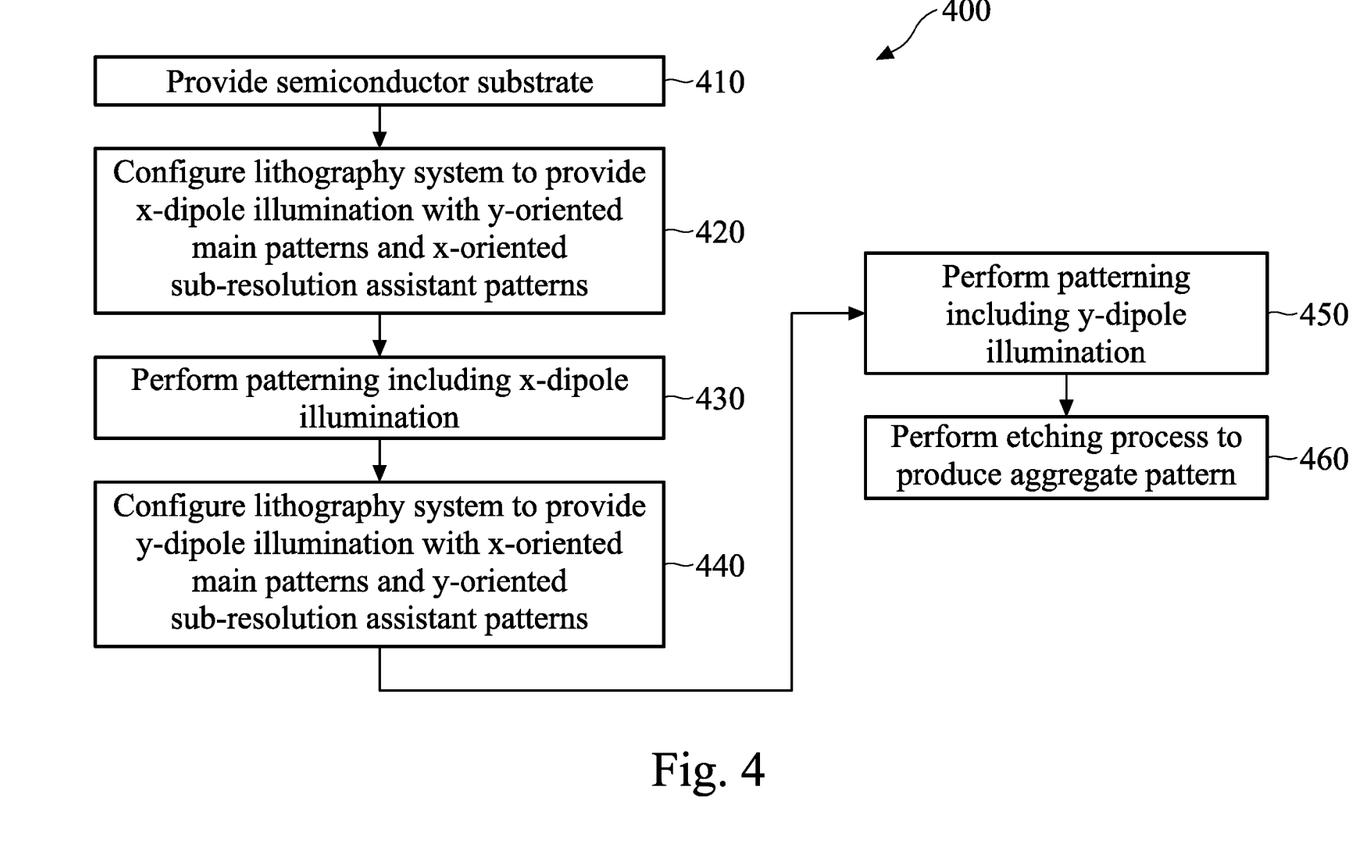
FIG. 4 shows a flow chart of a method of lithography patterning according to embodiments of the present disclosure.

FIG. 4 shows a flow chart of a method 400 of performing photolithography exposure processes using co-designed masks and dipole illumination, according to embodiments of the present disclosure. The method 400 includes operations 410, 420, 430, 440, 450, and 460. It is understood that additional operations can be provided before, during, and after the method 400, and some operations described can be replaced, eliminated, or moved around for additional embodiments of the method. The method 400 is an example, and is not intended to limit the present disclosure beyond what is explicitly recited in the claims.

At operation 410, the method 400 provides a semiconductor substrate. The semiconductor substrate may be coated with a photosensitive material (e.g., photoresist such as a chemical amplification resist (CAR)). The substrate may be substantially similar to the substrate 160, described above with reference to FIG. 1.

At operation 420, the method 400 provides a lithography system. The lithography system may be substantially similar to the lithography system 100, described above with reference to FIG. 1. The method 400 further configures the lithography system to provide x-dipole illumination. This includes coupling a first diffractive optical element (DOE) to the lithography system, wherein the first DOE includes a first pair of poles that is positioned symmetrically about a center of the first DOE along x-axis. This further includes coupling a first mask to the lithography system. The first mask includes first main patterns and first sub-resolution assistant patterns. The first main patterns are oriented along y-axis that is perpendicular to the x-axis, and the first sub-resolution assistant patterns are oriented along the x-axis. Both the x-axis and the y-axis are perpendicular to the optical axis of the lithography system. In an embodiment, a pattern density of the first sub-resolution assistant patterns is within ±15% of a pattern density of the first main patterns. In a further embodiment, the pattern density of the first sub-resolution assistant patterns ranges from 15% to 25%.

At operation 430, the method 400 performs an exposure process using the x-dipole illumination to form an image on the semiconductor substrate. The image includes features formed from the first main patterns but not the first assistant patterns. The features are oriented along the y-axis in the present embodiment. The method 400 may perform additional steps such as developing the images to form a resist masking element, etching the semiconductor substrate using the resist masking element, and depositing additional layers including another resist layer over the semiconductor substrate.

At operation 440, the method 400 configures the lithography system to provide y-dipole illumination. This includes coupling a second DOE to the lithography system (or replacing the first DOE with a second DOE), wherein the second DOE includes a second pair of poles that is positioned symmetrically about the center of the second DOE along the y-axis. This further includes coupling a second mask to the lithography system (or replacing the first mask with a second mask). The second mask includes second main patterns and second sub-resolution assistant patterns. The second main patterns are oriented along the x-axis, and the second sub-resolution assistant patterns are oriented along the y-axis. In an embodiment, a pattern density of the second sub-resolution assistant patterns is within ±15% of a pattern density of the second main patterns. In a further embodiment, the pattern density of the second sub-resolution assistant patterns ranges from 15% to 25%.

At operation 450, the method 400 performs an exposure process using the y-dipole illumination to form another image on the semiconductor substrate. This image includes features formed from the second main patterns but not the second assistant patterns. The features are oriented along the x-axis in the present embodiment.

At operation 460, the method 400 develops the images to form another resist masking element and performs one or more etching processes to the semiconductor substrate to produce aggregate patterns from the two exposure processes. The one or more etching processes may include wet etching, dry etching, reactive ion etching, and/or other etching techniques.

Although not intended to be limiting, one or more embodiments of the present disclosure provide many benefits to IC design and manufacturing. For example, embodiments of the preset disclosure provide a novel scheme for co-optimizing mask pattern and dipole illumination. With this scheme, the process window for designing sub-resolution assistant patterns on a mask is enlarged, which leads to enhanced pattern fidelity for photolithography.

In one exemplary aspect, the present disclosure is directed to a photolithography system. The system includes a substrate stage for holding a workpiece, and a mask having main patterns and sub-resolution assistant patterns. The system further includes a diffractive optical element (DOE) for directing a radiation having an aerial image of the main patterns onto the workpiece. The DOE includes a first pair of poles that is positioned symmetrically about a center of the DOE along a first direction. The main patterns are oriented lengthwise along a second direction that is perpendicular to the first direction. The sub-resolution assistant patterns are oriented lengthwise along the first direction.

In another exemplary aspect, the present disclosure is directed to a photolithography system. The system includes a radiation source for providing a radiation, a mask having main patterns and sub-resolution assistant patterns, and a diffractive optical element (DOE) for directing the radiation to a substrate through the mask. The DOE includes a pair of poles that is positioned symmetrically about a center of the DOE along a first direction. The main patterns are oriented along a second direction that is perpendicular to the first direction. The sub-resolution assistant patterns are oriented along the first direction. Both the first and second directions are perpendicular to an optical axis of the radiation. A pattern density of the sub-resolution assistant patterns is within ±15% of a pattern density of the main patterns.

In yet another exemplary aspect, the present disclosure is directed to a method. The method includes providing a photolithography system and coupling a first diffractive optical element (DOE) to the photolithography system, wherein the first DOE includes a first pair of poles that is positioned symmetrically about a center of the first DOE along a first direction. The method further includes coupling a first mask to the photolithography system, wherein the first mask includes first main patterns and first sub-resolution assistant patterns, the first main patterns are oriented along a second direction that is perpendicular to the first direction, and the first sub-resolution assistant patterns are oriented along the first direction. The method further includes performing a first exposure process to form a first image on a substrate using the first DOE and the first mask. The method further includes coupling a second DOE to the photolithography system, wherein the second DOE includes a second pair of poles that is positioned symmetrically about a center of the second DOE along the second direction. The method further includes coupling a second mask to the photolithography system, wherein the second mask includes second main patterns and second sub-resolution assistant patterns, the second main patterns are oriented along the first direction, and the second sub-resolution assistant patterns are oriented along the second direction. The method further includes performing a second exposure process to form a second image on the substrate using the second DOE and the second mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography system, comprising:
   a substrate stage for holding a workpiece;
   a mask having main patterns and sub-resolution assistant patterns, wherein a first main pattern of the main patterns has an end surface extending perpendicular to a longitudinal axis of the first main pattern; and
   a diffractive optical element (DOE) for directing a radiation having an aerial image of the main patterns onto the workpiece, wherein the DOE includes a first pair of poles that is positioned symmetrically about a center of the DOE along a first direction,
   wherein:
      the main patterns are oriented lengthwise along a second direction that is perpendicular to the first direction,
      the sub-resolution assistant patterns are oriented lengthwise along the first direction, and
      a first sub-resolution assistant pattern of the sub-resolution assistant patterns extends parallel to and is adjacent to the end surface of the first main pattern.

2. The photolithography system of claim 1, wherein the main patterns have a width that is more than twice of a width of the sub-resolution assistant patterns.

3. The photolithography system of claim 1, wherein the sub-resolution assistant patterns have a same pattern density as the main patterns.

4. The photolithography system of claim 1, wherein a pattern density of the sub-resolution assistant patterns is within ±15% of a pattern density of the main patterns.

5. The photolithography system of claim 1, wherein the sub-resolution assistant patterns have a pattern density ranging from 15% to 25%.

6. The photolithography system of claim 1, wherein the main patterns have a first pitch and a second pitch different from the first pitch, the first pair of poles is designed for the first pitch, and the DOE further includes a second pair of poles that is designed for the second pitch.

7. The photolithography system of claim 1, wherein the DOE further includes a second pair of poles that is positioned symmetrically about the center along a third direction, and a third pair of poles that is positioned symmetrically about the center along a fourth direction, wherein the first, third, and fourth directions intersect at the center of the DOE.

8. The photolithography system of claim 7, wherein the second and third pairs of poles are positioned symmetrically about the first direction.

9. The photolithography system of claim 8, wherein each of the second and third pairs of poles have a shorter pole-to-pole distance than the first pair of poles.

10. A photolithography system, comprising:
    a radiation source for providing a radiation;
    a mask having main patterns and sub-resolution assistant patterns; and
    a diffractive optical element (DOE) for directing the radiation to a substrate through the mask, wherein the DOE includes a pair of poles that is positioned symmetrically about a center of the DOE along a first direction,
    wherein the main patterns are oriented along a second direction that is perpendicular to the first direction, the sub-resolution assistant patterns are oriented along the first direction, both the first and second directions are perpendicular to an optical axis of the radiation,
    wherein a longitudinal axis of a first main pattern of the main patterns intersects a first sub-resolution assistant pattern of the sub-resolution assistant patterns, and
    wherein a pattern density of the sub-resolution assistant patterns is within ±15% of a pattern density of the main patterns.

11. The photolithography system of claim 10, wherein the sub-resolution assistant patterns have a pattern density ranging from 15% to 25%.

12. The photolithography system of claim 10, wherein the main patterns have a first pitch, and the sub-resolution assistant patterns have a second pitch less than half of the first pitch.

13. The photolithography system of claim 12, wherein the main patterns have a first width, and the sub-resolution assistant patterns have a second width less than half of the first width.

14. The photolithography system of claim 10, wherein the main patterns have multiple pitches, the DOE has multiple pairs of poles, and each pair of poles is designed for each pitch.

15. The photolithography system of claim 10, wherein the radiation has a central wavelength of 193 nm.

16. The photolithography system of claim 10, wherein the first sub-resolution assistant pattern has a first end surface that is co-planar with a side surface of a second main pattern of the main patterns and a second end surface opposite the first end surface and that is co-planar with a side surface of a third main pattern of the main patterns.

17. A method, comprising:
providing a photolithography system;
coupling a first diffractive optical element (DOE) to the photolithography system, wherein the first DOE includes a first pair of poles that is positioned symmetrically about a center of the first DOE along a first direction;
coupling a first mask to the photolithography system, wherein:
- the first mask includes first main patterns and first sub-resolution assistant patterns,
- the first main patterns are oriented along a second direction that is perpendicular to the first direction,
- the first sub-resolution assistant patterns are oriented along the first direction, and
- a longitudinal axis of a main pattern of the first main patterns intersects a sub-resolution assistant pattern of the first sub-resolution assistant patterns;

performing a first exposure process to form a first image on a substrate using the first DOE and the first mask;
coupling a second DOE to the photolithography system, wherein the second DOE includes a second pair of poles that is positioned symmetrically about a center of the second DOE along the second direction;
coupling a second mask to the photolithography system, wherein the second mask includes second main patterns and second sub-resolution assistant patterns, the second main patterns are oriented along the first direction, and the second sub-resolution assistant patterns are oriented along the second direction; and
performing a second exposure process to form a second image on the substrate using the second DOE and the second mask.

18. The method of claim 17, further comprising:
performing an etching process to the substrate, thereby producing a pattern defined by an aggregation of the first image and the second image.

19. The method of claim 17, wherein a pattern density of the first sub-resolution assistant patterns is within ±15% of a pattern density of the first main patterns, and a pattern density of the second sub-resolution assistant patterns is within ±15% of a pattern density of the second main patterns.

20. The method of claim 19, wherein the pattern density of the first sub-resolution assistant patterns ranges from 15% to 25%, and the pattern density of the second sub-resolution assistant patterns ranges from 15% to 25%.

* * * * *